United States Patent
Teh et al.

(10) Patent No.: US 9,292,113 B2
(45) Date of Patent: Mar. 22, 2016

(54) DRIVING CIRCUIT WITH FAULT DETECTION AND OPTICAL INPUT DEVICE HAVING THE SAME

(71) Applicant: PIXART IMAGING (PENANG) SDN. BHD., Penang (MY)

(72) Inventors: Lee Ling Teh, Penang (MY); Poh Weng Yem, Pulau Pinang (MY); Keng Yeam Chang, Penang (MY)

(73) Assignee: PIXART IMAGING (PENANG) SDN. BHD., Penang (MY)

( * ) Notice: Subject to any disclaimer, the term of this patent is extended or adjusted under 35 U.S.C. 154(b) by 127 days.

(21) Appl. No.: 14/287,186

(22) Filed: May 26, 2014

(65) Prior Publication Data

US 2015/0338931 A1    Nov. 26, 2015

(51) Int. Cl.
  *G06F 3/038* (2013.01)
  *G06F 3/03* (2006.01)
  *G06F 3/0354* (2013.01)

(52) U.S. Cl.
  CPC ............ *G06F 3/0383* (2013.01); *G06F 3/0317* (2013.01); *G06F 3/0354* (2013.01)

(58) Field of Classification Search
  CPC .... G06F 3/0383; G06F 3/0317; G06F 3/0354
  USPC .................................................. 345/166, 175
  See application file for complete search history.

(56) References Cited

U.S. PATENT DOCUMENTS 7,064,311 B2* 6/2006 Jung .......................... G01J 1/42
                                                            250/205
2006/0255152 A1* 11/2006 Xie ........................ G06F 3/0383
                                                          235/472.01

* cited by examiner

*Primary Examiner* — Sahlu Okebato
(74) *Attorney, Agent, or Firm* — Li & Cai Intellectual Property (USA) Office

(57) ABSTRACT

The present disclosure provides a driving circuit, which includes a switch, a driver unit, a fault detection circuit, and a processor. The switch is coupled between a power terminal and an anode of a light emitting diode (LED) of a light source. The driver unit is coupled between a cathode of the LED and a ground for generating a driving current according to a control signal. The fault detection circuit operatively detects whether the cathode of the LED is shorted and generate a fault signal when detected that the cathode of the LED is shorted. The processor initiates a fault detection period, during which the processor turns off the switch and the driver unit causes the cathode of the LED to be floating while activates the fault detection circuit to detect whether the cathode of the LED is shorted.

16 Claims, 8 Drawing Sheets

DRIVING CIRCUIT WITH FAULT DETECTION AND OPTICAL INPUT DEVICE HAVING THE SAME

BACKGROUND

1. Technical Field

The present disclosure relates to a driving circuit and an optical input device, in particular, to a driving circuit with fault detection mechanism for an optical input device and an optical input device having the same.

2. Description of Related Art

Optical input devices, such as optical mice, for the use of cursor navigation on a computer screen have been commonly known in the art. Specifically, optical input devices are operable to estimate relative movements between the optical input devices and navigation surfaces to perform tracking operations.

An optical input device typically includes a light source for illuminating a navigation surface to image. For an optical mouse, the light source, such as a light emitting diode (LED) or a laser diode, is configured to illuminate the navigation surface underneath the optical mouse.

While the optical mouse moves across the navigation surface, the light source is turned on at a constant frequency based on the frame rate of an image capturing sensor built-in in the optical mouse. The image capturing sensor operatively receives the light reflected from the navigation surface to successively capture frames of the navigation surface for the optical mouse to track the displacement thereof relative to the navigation surface, wherein the displacement of the optical mouse is used to control the operation a cursor displayed on a display.

Recently, a concern with the optical mouse is the eye safety hazard. It has been known that human eyes could be easily harmed or damaged if the human eye is subject to inadvertent exposure to the light source (e.g., LED) generating brightness that is unsafe for the human eye due to excessive current, such as when the optical mouse falls or is otherwise displaced from the navigation surface.

SUMMARY

Accordingly, the present disclosure provides a driving circuit with fault detection and an optical input device having the same, which incorporate a simple, low cost built-in fault detection mechanism and are operable to provide effectively safety guard against eye safely hazard.

An exemplary embodiment of the present disclosure provides a driving circuit which is used for an optical input device. The driving circuit includes a switch, a driver unit, a fault detection circuit, and a processor. The switch has a first end, a second end, and a control end. The first end of the switch is coupled to a power terminal to receive a supplying voltage. The second end of the switch is coupled to an anode of a light emitting diode (LED) of a light source. The driver unit is coupled between a cathode of the LED and a ground. The driver unit is configured to operatively generate a driving current controlling the illumination of the LED according to a control signal. The fault detection circuit is coupled to the cathode of the LED. The fault detection circuit is configured to operatively detect whether the cathode of the LED is shorted and generate a fault signal when detected that the cathode of the LED is shorted. The processor is coupled to the control end of the switch, the LED, the driver unit, and the fault detection circuit. The processor operatively outputs the control signal to control the illumination of the LED according to the brightness of a navigation surface of the optical input device.

The processor initiates a fault detection period, during which the processor turns off the switch and the driver unit to cause the cathode of the LED to be floating while activates the fault detection circuit to detect whether the cathode of the LED is shorted. The processor operatively turns off the switch and disables the operation of the optical input device upon receiving the fault signal.

An exemplary embodiment of the present disclosure provides an optical input device. The optical input device includes a light source, an image capturing sensor, and the aforementioned driving circuit. The driving circuit is coupled to the light source and the image capturing sensor. The light source having at least a LED is configured to operatively illuminate a navigation surface of the optical input device. The image capturing sensor is configured for capturing images reflected from the working surface. The driving circuit is configured for operatively detecting whether the LED has been shorted so as to detect whether the brightness generated by the LED might result in an eye safety hazard. The driving circuit further controls the driving current flowing through the LED for controlling the illumination of the LED.

To sum up, exemplary embodiments of the present disclosure provides a driving circuit with fault detection for and an optical input device having the same. The driving circuit incorporates a fault detection mechanism which operative to provide an effectively safety guard against eye safely hazard. The driving circuit is operable to determine whether the light source of the optical input device has been shorted and disables the operation of the optical input device when detected that the light source is shorted. Thereby, effectively prevents the light source from generating brightness that exceeds the eye safety requirement due to excessive driving current and causing potentially hazards to the end user.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
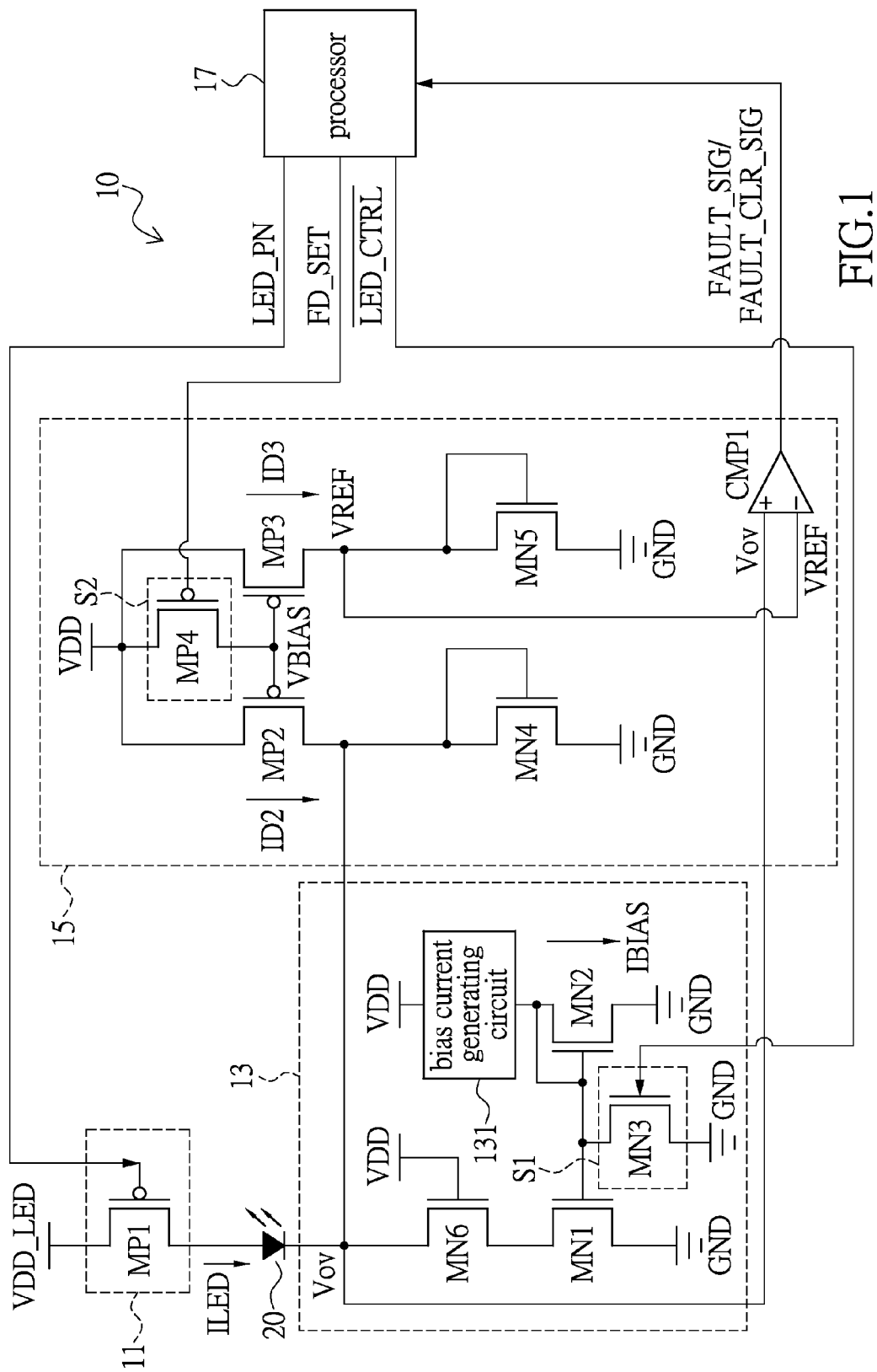
FIG. 1 is a schematic diagram of a driving circuit for an optical input device provided in accordance to an exemplary embodiment of the present disclosure.

Reference will now be made in detail to the exemplary embodiments of the present disclosure, examples of which are illustrated in the accompanying drawings. Wherever possible, the same reference numbers are used in the drawings and the description to refer to the same or like parts.

The main spirit of the present disclosure is to provide a driving circuit, which is adapted for an optical input device. The driving circuit incorporates a fault detection mechanism for providing safety guard against eye safety hazard. Additionally, the present disclosure further provides circuitries for calibrating the driving current to a target current level for image capturing sensors to successively capture frame for tracking the movement of the optical input device.

Information regarding the hardware architecture of the optical input device, as well as the basic operations of the optical input device such as image capturing and analyzing operations, displacement computation, and cursor control operation are commonly known to those skilled in the art. Hence detailed explanations are omitted herein, and only the related information concerning the present disclosure will be provided in the present disclosure.

(An Exemplary Embodiment of a Driving Circuit for an Optical Input Device)

Please refer to FIG. 1, which shows a schematic diagram illustrating a driving circuit for an optical input device provided in accordance to an exemplary embodiment of the present disclosure.

The driving circuit 10 is adapted for an optical input device (not shown in FIG. 1). Particularly, the driving circuit 10 is configured to operatively control the illumination operation of a light source in the optical input device based on the brightness of a navigation surface (such as a mouse pad or a desktop) of the optical input device. The optical input device can include but not limited to a wireless optical mouse, a wireless track pad, or a wireless joystick. The light source can comprise of a light-emitting diode (LED) or a laser diode (LD).

The driving circuit 10 includes a switch 11, a driver unit 13, a fault detection circuit 15, and the processor 17. The switch 11, the driver unit 13, and the fault detection circuit 15 are coupled to the processor 17, respectively. The processor 17 controls the operations of the switch 11, the driver unit 13, and the fault detection circuit 15 according to the operation of the optical input device.

Specifically, the switch 11 has a first end, a second end, and a control end. The first end of the switch 11 is coupled to a power terminal for receiving a supplying voltage VDD_LED and the second end of the switch 11 is coupled to a first end of the light source. The control end of the switch 11 is coupled to the processor 17 to receive a power signal LED_PN. That is, the switch 11 selectively conducts to supply the supplying voltage VDD_LED to the light source according to the voltage level of the power signal LED_PN received. In the instant embodiment, the switch 11 is implemented by an active low switch, i.e., the switch 11 conducts upon receiving an active low signal and cuts off upon receiving an active high signal.

The driver unit 13 is coupled between a second end of the light source and a ground GND. The driver unit 13 is configured for operatively adjusting a driving current ILED to control the illumination operation of the light source according to a control signal $\overline{LED\_CTRL}$ outputted by the processor 17.

The fault detection circuit 15 is coupled to the second end of the light source for detecting whether or not the second end of the light source has been shorted. In particular, the fault detection circuit 15 operatively detects whether the brightness of the light source have exceeded the eye safety level upon receiving a fault detection signal FD_SET (e.g., an active high signal). Since when the second end of the light source is shorted, the driver unit 13 is unable to control the driving current ILED flowing through the light source and the driving current ILED might increase causing the light intensity generated to exceed an eye safety level and become harmful to human eyes.

The processor 17 operatively outputs the power signal LED_PN, and the control signal $\overline{LED\_CTRL}$ to control the operations of the switch 11 and the driver unit 13, respectively during the operation of the optical input device. The processor 17 outputs the power signal LED_PN and the control signal $\overline{LED\_CTRL}$ according to the frame capturing rate of the optical input device so as to perform the image capturing and tracking operations. Moreover, the processor 17 can be configured to regularly (e.g., before/after every frame capturing period of the optical input device) output the fault detection signal FD_SET to the fault detection circuit 15 to drive the fault detection circuit 15 to detect whether the second end of the light source has been shorted.

In the instant embodiment, the switch 11 includes a PMOS transistor MP1; the driver unit 13 includes NMOS transistors MN1, MN2, and MN6, a bias current generating circuit 131, and a switch S1, wherein the switch S1 comprises of a NMOS transistor MN3; the fault detection circuit 15 includes a switch S2, PMOS transistors MP2 and MP3, NMOS transistors MN4 and MN5, and a comparator CMP1, wherein the switch S2 comprises of a PMOS transistor MP4; the light source includes a LED 20.

In the instant embodiment, the driving current ILED flowing through the LED 20 are configured such that the light intensity of the brightness generated by the LED 20 does not resulting in an eye safety hazard while being sufficient to illuminate the navigation surface of the optical input device to image.

More specifically, a source of the PMOS transistor MP1 is coupled to the power terminal to receive the supplying voltage VDD_LED. A drain of the PMOS transistor MP1 is coupled to an anode of the LED 20. A gate of the PMOS transistor MP1 is coupled to the processor 17 to receive the power signal LED_PN for selectively conducting the power terminal VDD_LED and the anode of the LED 20.

A drain of the NMOS transistor MN6 is coupled to a cathode of the LED 20 forming a detection node for outputting a detection voltage Vov. A source of the NMOS transistor MN6 is coupled to a drain of the NMOS transistor MN1. A gate of the NMOS transistor MN6 is coupled to a bias terminal to receive a constant operating voltage VDD for adjusting the impedance of the NMOS transistor MN6 to a constant value. That is, the NMOS transistor MN6 serves as an active resistor. A source of the NMOS transistor MN1 is coupled to the ground GND. The bias current generating circuit 131 is coupled between the bias terminal and the NMOS transistor MN2, in particular, the bias current generating circuit 131 is coupled to a drain of the NMOS transistor MN2. The bias current generating circuit 131 receives the operating voltage VDD and operatively generating a bias current IBIAS. A gate of the NMOS transistor MN2 is coupled to a gate of the NMOS transistor MN1. The drain of the NMOS transistor MN2 is also coupled to the gate of the NMOS transistor MN2. A source of the NMOS transistor MN2 is coupled to the ground. In other words, the NMOS transistor MN2 is configured as a current mirror for mirroring and amplifying the bias current IBIAS to the driver current ILED to adjust the driving current ILED to a target value. Those skilled in the art would appreciate that the bias current generating circuit 131 can be implemented using circuit configurations known in the art for generating a bias current having one or more current values according to the control signal $\overline{\text{LED\_CTRL}}$ outputted by the processor 17 or a bias voltage supplied and the present disclosure is not limited.

The NMOS transistor MN3 is coupled between the gate of NMOS transistor MN1 and the ground GND. Particularly, a drain of the NMOS transistor MN3 is coupled to the gate of the NMOS transistor MN1 and the gate of the NMOS transistor MN2. A source of the NMOS transistor MN3 is coupled to the ground GND. A gate of the NMOS transistor MN3 is coupled to the processor 17 to receive the control signal $\overline{\text{LED\_CTRL}}$. The NMOS transistor MN3 is configured to control the conduction operations of NMOS transistors MN1 and MN2. Specifically, when the processor 17 outputs the control signal $\overline{\text{LED\_CTRL}}$ of low voltage level and cuts off the NMOS transistor MN3, the NMOS transistor MN2 operatively mirrors and amplifies the bias current IBIAS to the driving current ILED; when the processor 17 outputs the control signal $\overline{\text{LED\_CTRL}}$ of high voltage level causing the NMOS transistor MN3 to conduct, the NMOS transistor MN3 operatively pulls down the gate voltage of the NMOS transistor MN1 and MN2 to the ground GND and cuts off the NMOS transistors MN1 and MN2. In other words, NMOS transistor MN3 serves as a switch for controlling the mirroring operation of the bias current IBIAS. For the darker surface, the maximum driving current ILED adjusted should not exceed the eye safety level.

Next, the PMOS transistor MP3 is biased to generate the drain current of ID3, while the PMOS transistor MP2 is biased to generate the drain current of ID2. Technique for biasing the PMOS transistors MP2 and MP3 is common in the art, thus those skilled in the art should able to infer implementation for causing the PMOS transistor MP3 to generate the drain current ID3 and the PMOS transistor MP2 to generate the drain current ID2 and further description is hereby omitted. Specifically, in the instant embodiment, the PMOS transistor MP2 is designed to generate the drain current ID2 that is at least twice of the drain current ID3 of the PMOS transistor MP3.

Incidentally, the ratio of the channel width to the channel length of the PMOS transistor MP2 can be configured such that the drain current ID2 generated by the PMOS transistor MP2 is at least twice of the drain current ID3. Technique for configuring the channel width to the channel length configuration is common in the art, thus those skilled in the art should able to infer implementation for causing the PMOS transistor MP2 to generate the drain current ID2 that is at least twice of the drain current ID3 and further description is hereby omitted.

To put it concretely, a source of the PMOS transistor MP2 and a source of the PMOS transistor MP3 are both coupled to the bias terminal to receive the constant operating voltage VDD. A gate of the PMOS transistor MP2 and a gate of the PMOS transistor MP3 are coupled to each other, and are configured to receive a biasing voltage of VBIAS from a bias circuit (not shown). Moreover, the PMOS transistor MP4 are coupled between the gates of PMOS transistors MP2, MP3 and the bias terminal. A gate of the PMOS transistor MP4 is coupled to the processor 17 to receive a fault detection signal FD_SET. A source of the PMOS transistor MP4 is coupled to the bias terminal to receive the constant operating voltage VDD. A drain of the PMOS transistor MP4 is coupled to the gates of PMOS transistors MP2 and MP3. A drain of the PMOS transistor MP2 is coupled to the detection node for weakly pulling up the detection node to the drain voltage of the PMOS transistor MP2. The drain of the PMOS transistor MP2 is also coupled to a drain of the NMOS transistor MN4.

The NMOS transistor MN4 is configured in a diode connection. Specifically, a gate of the NMOS transistor MN4 is coupled to the drain thereof. A source of the NMOS transistor MN4 is coupled to the ground GND. Similarly, a drain of PMOS transistor MP3 is coupled to a drain of the NMOS transistor MN5. The NMOS transistor MN5 is also configured in a diode connection. Specifically, a gate of the NMOS transistor MN5 is coupled to the drain thereof. A source of the NMOS transistor MN5 is coupled to the ground GND.

The comparator CMP1 has a first input terminal (e.g., non-inverting terminal), a second input terminal (e.g., inverting terminal), and a first output terminal. The first input terminal of the comparator CMP1 is coupled to the detection node to receive the detection voltage Vov. The second input terminal of the comparator CMP1 is coupled to a junction formed between the drain of the PMOS transistor MP3 and the drain of the NMOS transistor MN5 to receive a reference voltage VREF. The first output terminal of the comparator CMP1 is coupled to the processor 17. The comparator CMP1 operatively compares the detection voltage Vov and the reference voltage VREF and correspondingly outputs the detection result i.e., the fault signal FAULT_SIG or the fault clear signal FAULT_CLR_SIG to the processor 17 via the first output terminal.

Briefly, the processor 17 operatively initiates a fault detection period, during which the switch 11 and the driver unit 13 is turned off while the fault detection circuit 15 weakly pulls up the detection node upon receiving the fault detection signal FD_SET. When the cathode of the LED 20 is not shorted, the detection node is weakly pulled up to the drain voltage of PMOS transistor MP2, wherein the drain voltage of the PMOS transistor MP2 is designed or scaled to be at least twice higher than the drain voltage of the transistor MP3.

When the detection voltage Vov outputted by the detection node is greater than the reference voltage VREF, the comparator CMP1 outputs a fault clear signal FAULT_CLR_SIG (i.e., a signal with high voltage level) to the processor 17 indicating that the cathode of the LED 20 has not been shorted. Conversely, when the detection voltage Vov outputted by the detection node is less than the reference voltage VREF (e.g., the detection voltage Vov has been pulled down), the comparator CMP1 outputs a fault signal FAULT_SIG (i.e., a signal with low voltage level) to the processor 17 indicating that the cathode of the LED 20 is shorted.

The processor 17 determines whether the cathode of the LED 20 has been shorted based on the detection results generated by the comparator CMP1. When the processor 17 receives the fault signal FAULT_SIG from the first output terminal of the comparator CMP1, indicating a fault being found, the processor 17 instantly turns off the switch 11 to disable the operation of the LED 20 and the image capturing sensor of the optical input device so as to disable the optical input device, thereby eliminate the possibility of causing eye safety hazard to the end user. When the processor 17 receives the fault clear signal FAULT_CLR_SIG from the first output terminal of the comparator CMP1, the processor 17 enables the tracking operation of the optical input device, wherein the tracking operation of the optical input device at least includes the frame capturing operation and the displacement computation.

Figure 2:
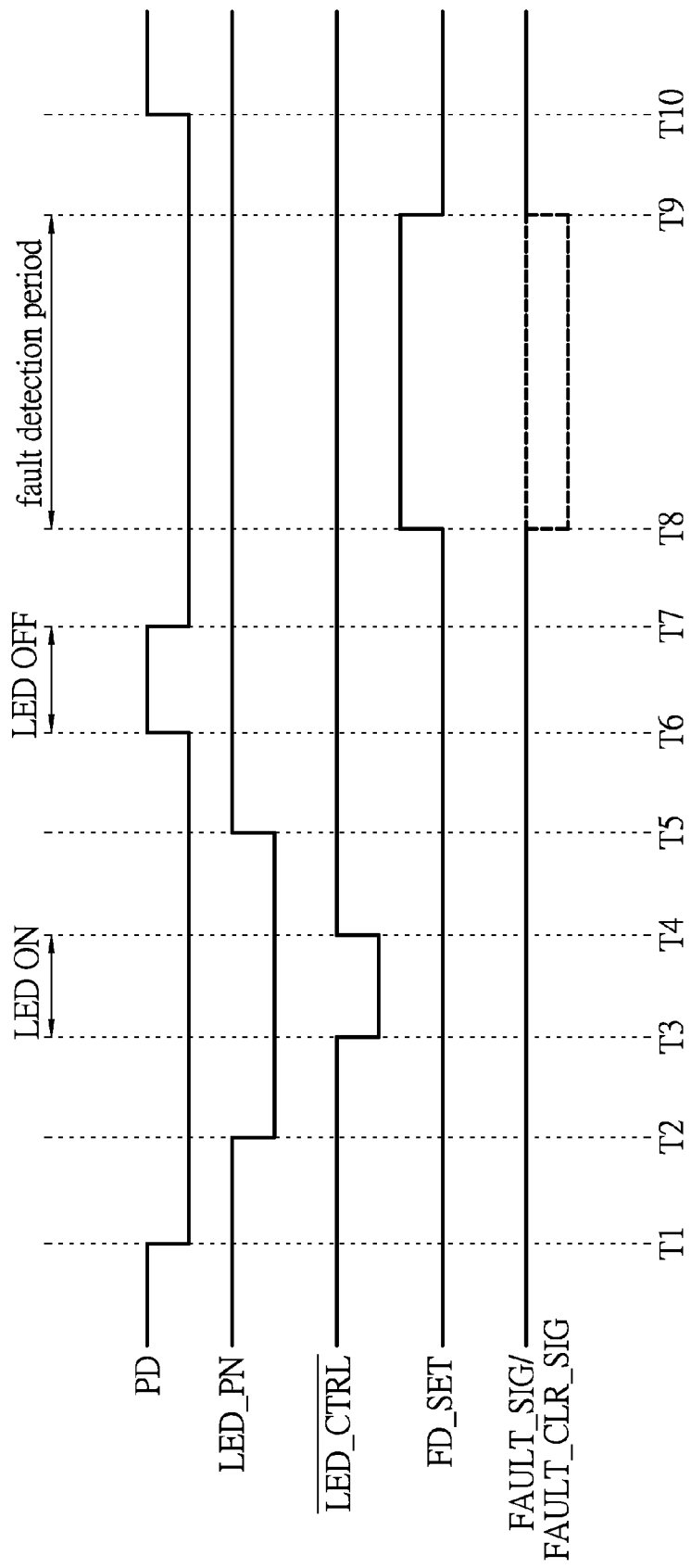
FIG. 2 is a timing diagram illustrating a circuit operation of the driving circuit provided in accordance to the exemplary embodiment of the present disclosure.

The main operation of the driving circuit 10 can be summarized as follow. Please refer to FIG. 2 in conjunction with FIG. 1. FIG. 2 shows a timing diagram illustrating a circuit operation of the driving circuit provided in accordance to the exemplary embodiment of the present disclosure.

During the operation of the optical input device, the processor 17 operatively initiates a frame capturing period according to the frame capturing rate (e.g., 500 frames per second~1000 frames per second). The frame capturing rate can be configured according to the operational requirement of the optical input device and can be pre-stored in the optical input device. The processor 17 can regularly initiate the fault detection period to constantly detect whether the cathode of the LED 20 has been shorted, such as when the optical input device is powered on, before and after each frame capturing period, or once every five frames captured depend upon the operational requirement of the optical input device and the present disclosure is not limited thereto.

More specifically, at time point T1 (e.g., the start of the frame capturing period), the processor 17 operatively issues a power down signal PD of low voltage level to cause the optical input device to operate in an active mode. The power down signal PD herein is a signal used to disable the operation of the optical input device, such as causing the optical input device to enter a power-saving mode, for power conservation.

At time point T2, the processor 17 outputs the power signal LED_PN of low voltage level to turn on the switch 11. At time point T3, the processor 17 outputs the control signal $\overline{LED\_CTRL}$ of low voltage level to turn off the switch S1 (i.e., cuts off the NMOS transistor MN 3) and causing the NMOS transistor MN2 to mirror and amplify the bias current to the driving current ILED flowing through the LED 20 to a constant value such that the brightness generated by the LED 20 does not exceed the eye safety level while being sufficient to illuminate the navigation surface to image. During the frame capturing period (e.g., from time point T1~time point T4), the optical input device operatively illuminates the navigation surface thereof and capturing the image for performing the tracking operations (e.g., tracking the movement of the optical input device).

At time point T4, the processor 17 outputs the control signal $\overline{LED\_CTRL}$ of high voltage level to turn on the switch S1 (i.e., conducts the NMOS transistor MN 3) and cuts off the NMOS transistors MN1, MN2 for disabling the current mirroring operation.

At time point T5 (e.g., after capturing the image), the processor 17 outputs the power signal LED_PN of high voltage level to turn off the switch 11 and cuts off the power path of supplying the supplying voltage VDD_LED to the LED 20. The processor 17 subsequently issues the power down signal PD of high voltage level to cause the optical input device to enter a power saving mode for power conservation. The processor 17 repeats the operation depicted from time point T1 to time point T7 according to the frame capturing rate of the optical input device.

At the time point T8, the processor 17 operatively issues the power down signal PD of low voltage level and initiates a fault detection period. To initiate the fault detection period, the processor 17 synchronously turns off the switch 11 and disable the operation of the driver unit 13 while triggers the fault detection circuit 15.

To put it concretely, the processor 17 outputs the power signal LED_PN of high voltage level and the control signal $\overline{LED\_CTRL}$ of high voltage level such that the cathode of the LED 20 or the detection node is floating. At the same time, the processor 17 outputs the fault detection signal FD_SET of high voltage level to cut off the PMOS transistor MP4 to allow the PMOS transistors MP2 and MP3 to conduct. Specifically, the processor 17 outputs the fault detection signal FD_SET to cut off the PMOS transistor MP4, to allow the gates of the PMOS transistors MP2 and MP3 to be biased and to cause the PMOS transistor MP3 to generate the drain current ID3 and the PMOS transistor MP2 to generate the drain current ID2 at a multiplier (e.g., 2×).

When the cathode of the LED 20 is not shorted, the cathode of the LED 20 is biased at a voltage level that is equal to the detection voltage Vov and the driving current ILED is controlled by the driver unit 13. However, when the cathode of the LED 20 is shorted, the voltage at the cathode of the LED 20 would equal to approximately 0V causing the driving current ILED to increase, which might lead to eye safety hazard.

During time point T8 and T10, the comparator CMP1 operatively compares the detection voltage Vov outputted by the detection node with the reference voltage VREF outputted by the junction formed between the drain of the PMOS transistor MP3 and the drain of the NMOS transistor MN5. The comparator CMP1 further outputs the detection results i.e., the fault signal FAULT_SIG or the fault clear signal FAULT_CLR_SIG to the processor 17.

As shown in FIG. 2, from time point T8 and time point T10, when the cathode of the LED has not been shorted, the processor 17 would receive the fault clear signal FAULT_CLR_SIG (e.g., high voltage level signal) from the comparator CMP1 i.e., the detection voltage Vov is greater than the reference voltage VREF. When detected that the cathode of the LED 20 is floating i.e., not shorted indicating that the driver unit 13 is in control of the driving current ILED, the processor 17 enables the tracking operations of optical input device.

During the fault detection period (e.g., from time point T8 to time point T9), when the processor 17 receives fault signal FAULT_SIG (e.g., low voltage level signal) from the comparator CMP1 i.e., the detection voltage Vov is less than the reference voltage VREF, the processor 17 turns off the switch 11 and driver unit 13 to disable the tracking operations of the optical input device so as to prevent the LED 20 from generating the brightness that is unsafe to human eyes. In other words, when faults found during the fault detection period, the processor 17 operatively disables the operation of the image capturing sensor and the light source of the optical input device and causes the optical input device to stop function while continue to detects whether the cathode of the LED 20 is shorted At time point T10, the processor 17 terminates the fault detection period by outputting the fault detection signal FD_SET of low voltage level to conduct the PMOS transistor MP4 so as to cut off the PMOS transistors MP2 and MP3. When no fault is found, the processor 17 enables the optical input device to continue the tracking operation; when fault is detected, the processor 17 operatively cause the optical input device to stop operate until the fault has been cleared or eliminated.

It is worth to note that the causes for the shorts to the cathode of LED 20 might be when a user opens up the casing of the optical input device for trouble shooting and accidently shorts the cathode of the LED 20 temporary via finger, or the cathode of the LED 20 has been shorted to the ground before factory shipment, such as shorted to ground with wiring during the assembly phase. Regardless the causes for the shorts of the cathode of the LED 20, so long as the shorts (or fault) have been detected at the cathode of the LED 20, the processor 17 would disable the operation (e.g., disable the image capturing sensor) of the optical input device until the fault have been cleared or eliminated. Hence, if the fault detection circuit 15 continuously detects that the cathode of the LED 20 is shorted for several frames (such as 5 or more frames), the optical input device would stop functioning until the fault has been manually resolved (e.g., mechanically analyze the internal circuitry of the driving circuit 10).

As previously described, the fault detection circuit 15 is configured to weakly pull up the detection voltage Vov to a certain voltage level that is greater than the reference voltage VREF to detect whether the cathode of the LED 20 has been shorted upon activation, thus the exact current multiplier of the PMOS transistor MP2 designed may be 2×, 3× or 4× depend upon operational and power requirements, and the present disclosure does not limited thereto. Those skilled in the art should be able to select the appropriate transistors for designing the current mirror circuit in the fault detection circuit based on the above elaboration and further descriptions are hereby omitted.

In the instant embodiment, the light source comprises a LED, however in practice, the light source can comprise of one or more LEDs depend upon practical operation requirement, and the present disclosure is not limited thereto. In another embodiment, the light source may comprise a series-connected LED string, having the anode of the first LED connected to the drain of the PMOS transistor MP1 and the cathode of the last LED connected to the drain of the NMOS transistor MN6 and the drain of the PMOS transistor MP2.

Moreover, the switch S2 may not be necessary in other circuitry implementation. More specifically, in other circuitry configuration, the processor 17 can be configured to directly connect to the gates of the PMOS transistors MP2 and MP3, and to output the fault detection signal FD_SET to control the operations of the PMOS transistors MP2 and MP3 to detect the detection voltage Vov. Those skilled in the art would appreciate that the circuitry of the fault detection circuit 15 can be changed accordingly to accommodate the operational requirement and the specific type of the transistor used.

Additionally, the processor 17 can be implemented by a processing chip, which is disposed in the optical input device. The processing chip can include but not limited to a microcontroller, or an embedded controller programmed with image capturing and fault detection algorithms via firmware design and the instant embodiment is not limited to the example provided herein. The processor 17 can be configured to initiate the fault detection period when the optical input device is power on, before/after capturing frame, after a predetermined number of frame capturing period (e.g., after every 5 frame capturing period), however, the instant embodiment is not limited thereto. In another embodiment, the processor 17 can also be programmed such that the processor 17 only disable the operation of the optical input device when a fault has been continuously found for consecutive frame capturing periods (such as 5 frame capturing periods) to avoid false detection.

In one embodiment, the processor 17 can determine whether to disable the operation of the optical input device through setting a fault flag. Specially, when fault is detected during the fault detection period, the processor 17 can set a fault flag upon receiving the fault signal FAULT_SIG. The processor 17 can reset or clear the fault flag upon receiving the fault clear signal FAULT_CLR_SING during the fault detection period. Thereafter, when the processor 17 detects the presence of the fault flag, the processor 17 operatively disables the image capturing sensor to disable the operation of the optical input device.

Moreover, the logic level configuration of the power signal LED_PN, the control signal $\overline{\text{LED\_CTRL}}$, and the fault detection signal FD_SET for controlling the operations of the switch 11, the driver unit 13, and the fault detection circuit 15 are configured based on the electrical characteristic of the circuit element used. In other embodiments, the circuitry of the switch 11 and the control signal $\overline{\text{LED\_CTRL}}$ can be configured to be active high, and the fault detection circuit 15 can be configured to be active low and the processor 17 outputs active high signal (i.e. a signal of high voltage level) to turn on or activate the switch 11 and the driver unit 13, and outputs an active low signal (i.e. signal of low voltage level) to turn ON the fault detection circuit 15.

It shall be noted that FIG. 1 merely serves to illustrate an embodiment of the driving circuit 10 and the present disclosure is not limited thereto. Similarly, FIG. 2 illustrates an operation of the driving circuit 10 and the present disclosure is not limited thereto. The exact circuitry structure, exact implementation method, and/or connection method associated with the light source, the switch 11, the driver unit 13, the fault detection circuit 15, and the processor 17 of the driving circuit 10 may depend upon the specific design and/or operational requirement of the optical input devices and shall not be limited to the examples provided by the instant embodiment.

The present disclosure further provides a couple of calibration techniques for precisely calibrating the driving current over processing factors such as temperature before factory shipment. Please refer to FIG. 3, which shows a diagram of a bias current generating circuit for the driving circuit provided in accordance to an exemplary embodiment of the present disclosure.

The bias current generating circuit 131 can be configured for supplying the biasing current IBIAS with zero temperature coefficient for finely adjusting the driving current ILED to a target value so as to compensate the processing discrepancy (e.g., temperature and voltage variation). In particular, the bias current generating circuit 131 is operable of generating the biasing current IBIAS which is independent of temperature variation to calibrate the driving current ILED to the target value. The target value is predetermined according the illumination requirement and/or operational requirement of the optical input device.

The bias current generating circuit 131 further includes a positive temperature coefficient current generating circuit 1311, a negative temperature coefficient current generating circuit 1313 and a zero temperature coefficient current generator 1315. The positive temperature coefficient current generating circuit 1311 and negative temperature coefficient current generating circuit 1313 are coupled to the zero temperature coefficient current generator 1315. The zero temperature coefficient current generator is coupled to the drain of the NMOS transistor MN2.

The positive temperature coefficient current generating circuit 1311 is configured for operatively generating a positive temperature coefficient current according to the temperature variation of the optical input device. The positive temperature coefficient current is proportional to the absolute temperature detected. The negative temperature coefficient current generating circuit 1313 is configured for operatively generating a negative temperature coefficient current according to the temperature variation of the optical input device. The negative temperature coefficient current is complementary to the absolute temperature detected.

The zero temperature coefficient current generator 1315 operatively sums the positive temperature coefficient current and the negative temperature coefficient current at a predetermined ratio so as to generate the bias current IBIAS with zero temperature coefficient. The zero temperature coefficient current generator 1315 further generates the bias current IBIAS with zero temperature coefficient and finely adjust the driving current ILED during the current mirroring operation of the NMOS transistor MN2 to compensate the processing discrepancy. The driver unit 13 thus can stably and constantly supplying the driving ILED flowing through the LED 20 at the target value invariant to temperature variation of the optical input device.

In practice, the bias current generating circuit 131 can comprise of a bandgap current reference circuit for generating the bias current IBIAS of zero temperature coefficient. In one implementation, the bandgap current reference circuit can be implemented by a BJT current mirror, an operational amplifier, and discrete electrical components such as resistors. The bandgap current reference circuit are commonly used in the art for eliminating the temperature variation characteristic in the biasing current, hence those skilled in art should be able to infer the implementation and operation of the bandgap current reference circuit, and further description is hereby omitted.

Figure 3:
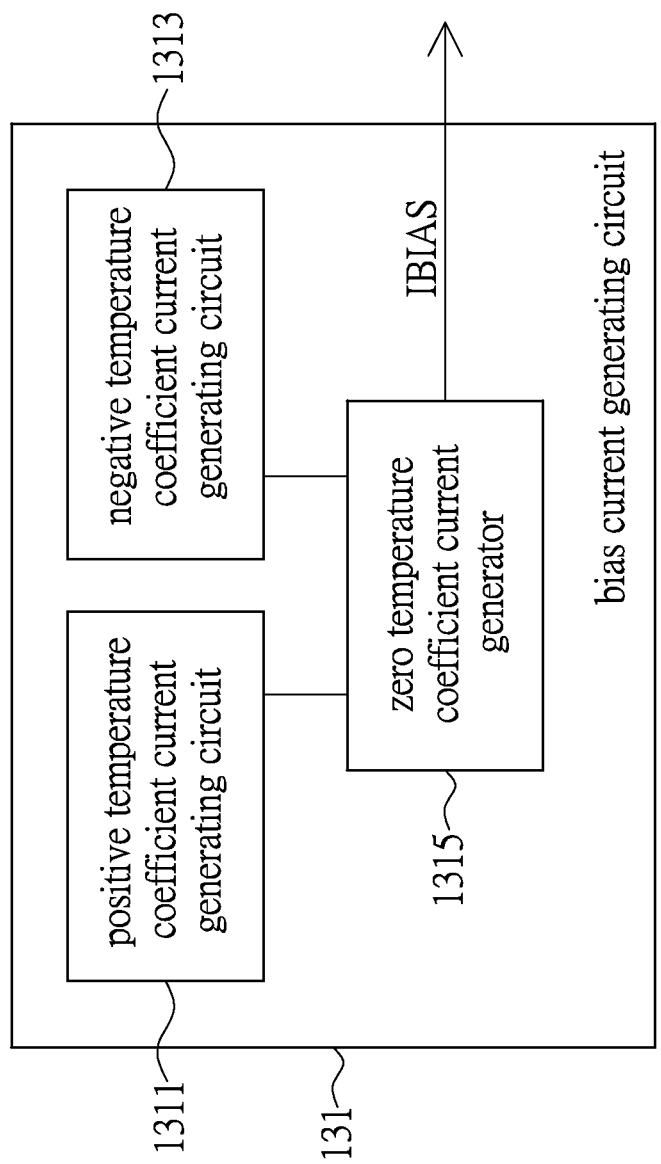
FIG. 3 is a diagram of a bias current generating circuit for the driving circuit provided in accordance to an exemplary embodiment of the present disclosure.

It worth to noted that FIG. 3 is only an illustration diagram provided in accordance to the instant embodiment of the present disclosure, and the present disclosure is not limited thereto. Similarly, the exact structure, the exact implementation method, and/or the exact connection method associated with the bias current generating circuit 131 may depend upon the specific design and/or operational requirement and shall not be limited thereto.

Next, in event that the processor 17 of the driving circuit 10 having a one-time programmable (OTP) register, the driving current can be calibrated through the use of OTP register and firmware configuration. Please refer to FIG. 4, which shows a schematic diagram illustrating a driving circuit for the optical input device provided in accordance to another exemplary embodiment of the present disclosure. The driving circuit 40 is operable to be calibrated to compensate the processing discrepancy (e.g. process variation) in the driving current.

Figure 4:
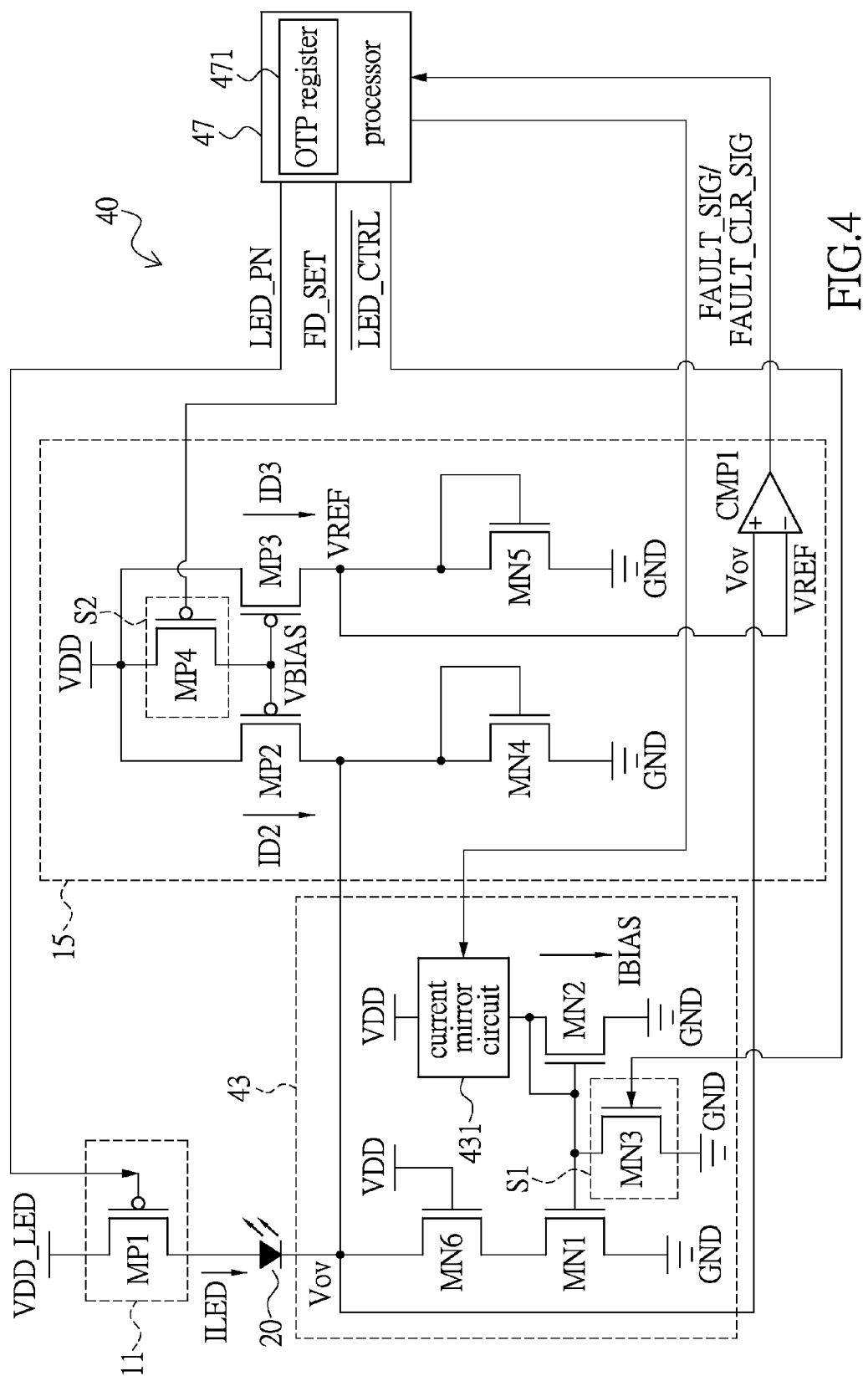
FIG. 4 is a schematic diagram of a driving circuit for an optical input device provided in accordance to another exemplary embodiment of the present disclosure.

The driving circuit 40 of FIG. 4 is differ from the driving circuit 10 of FIG. 1 in that a driving unit 43 of the driving circuit 40 has a current mirror circuit 431 in place of the bias current generating circuit and the processor 47 has an OPT register 471. The current mirror circuit 431 is coupled between the bias terminal and the drain of the NMOS transistor MN2. The current mirror circuit 431 receives a constant operating voltage VDD and operatively generates the bias IBIAS, which is further mirror and amplify to the driving current ILED flowing through the ILED by the NMOS transistor MN2 during the conduction time of the NMOS transistor MN2. The current mirror circuit 431 of the driver unit 43 is controlled by the processor 47.

More specifically, the current mirror circuit 431 includes a reference current branch (not shown) and a plurality of current mirror branches (not shown). The reference current branch is configured to operatively generate a reference current and each of the current mirror branches generates a biasing current at a multiplier of the reference current.

The processor 47 has the OTP register 471 defined in the nonvolatile memory block thereof. The processor 47 is operable to control reference current branch to configure the reference current. The processor 47 controls the operation of the current mirror branches according to the value stored in the OTP register 471. In the instant embodiment, the processor 47 is configured to execute a one-time calibrating procedure before the factory shipment of the optical input device for calibrating the driving current ILED. That is, to calibrate the driving current ILED so that the driving current ILED flowing through the LED 20 falls within a current range specified invariant to the fabrication factors such as temperature and voltage variations. The current range is defined by a maximum current limit and a minimum current limit, wherein the maximum current limit and the minimum current limit can be predefined and stored in the processor 47.

Specifically, upon execution of the calibration procedure, the processor 47 operatively turns on or turns off one or more current mirror branches according to detection result. In particular, the driving current ILED can be gradually increased by turning on the current mirror branches one by one and the driving current ILED can be gradually decreased by turning off the current mirror branches one by one.

Figure 5:
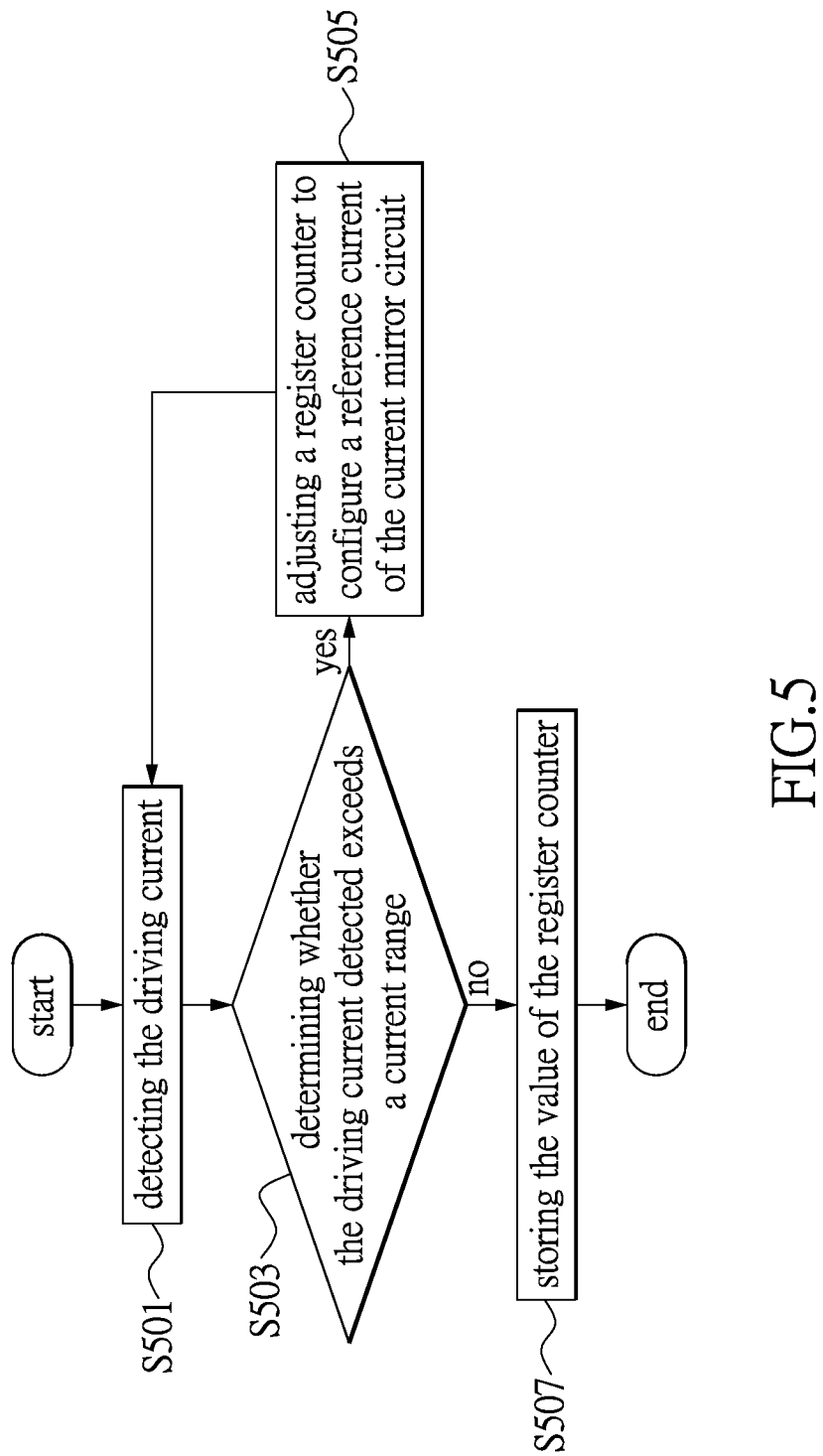
FIG. 5 is a flowchart illustrating a self-calibration procedure for an optical input device provided in accordance to an exemplary embodiment of the present disclosure.

Please refer to FIG. 5 in conjunction with FIG. 4 for further explanation on the operation of the driving circuit 40. FIG. 5 shows a flowchart illustrating a calibration procedure for an optical input device provided in accordance to an exemplary embodiment of the present disclosure.

In Step S501, the processor 47 turns on the driver unit 43 to generate the driving current ILED. A measurement equipment (not shown) is used in the instant embodiment to measure the driving current ILED. The measurement data is then fed to the processor 47. In Step S503, the processor 47 determines whether the driving current ILED detected exceeds the current range defined. When the processor 47 determines that the driving current ILED exceeds the current range, the processor 47 executes Step S505; otherwise, the processor 47 executes Step S507.

In Step S505, the processor 47 operatively adjusts a register counter and returns to Step S501. Specifically, the processor 47 configures a reference current of the current mirror circuit based on the register counter stored and correspondingly turns on or turns off current mirror branches one by one to adjust the driving current ILED in steps. In Step S507, the processor 47 stores the value of the register counter into the OTP register 471.

Figure 6:
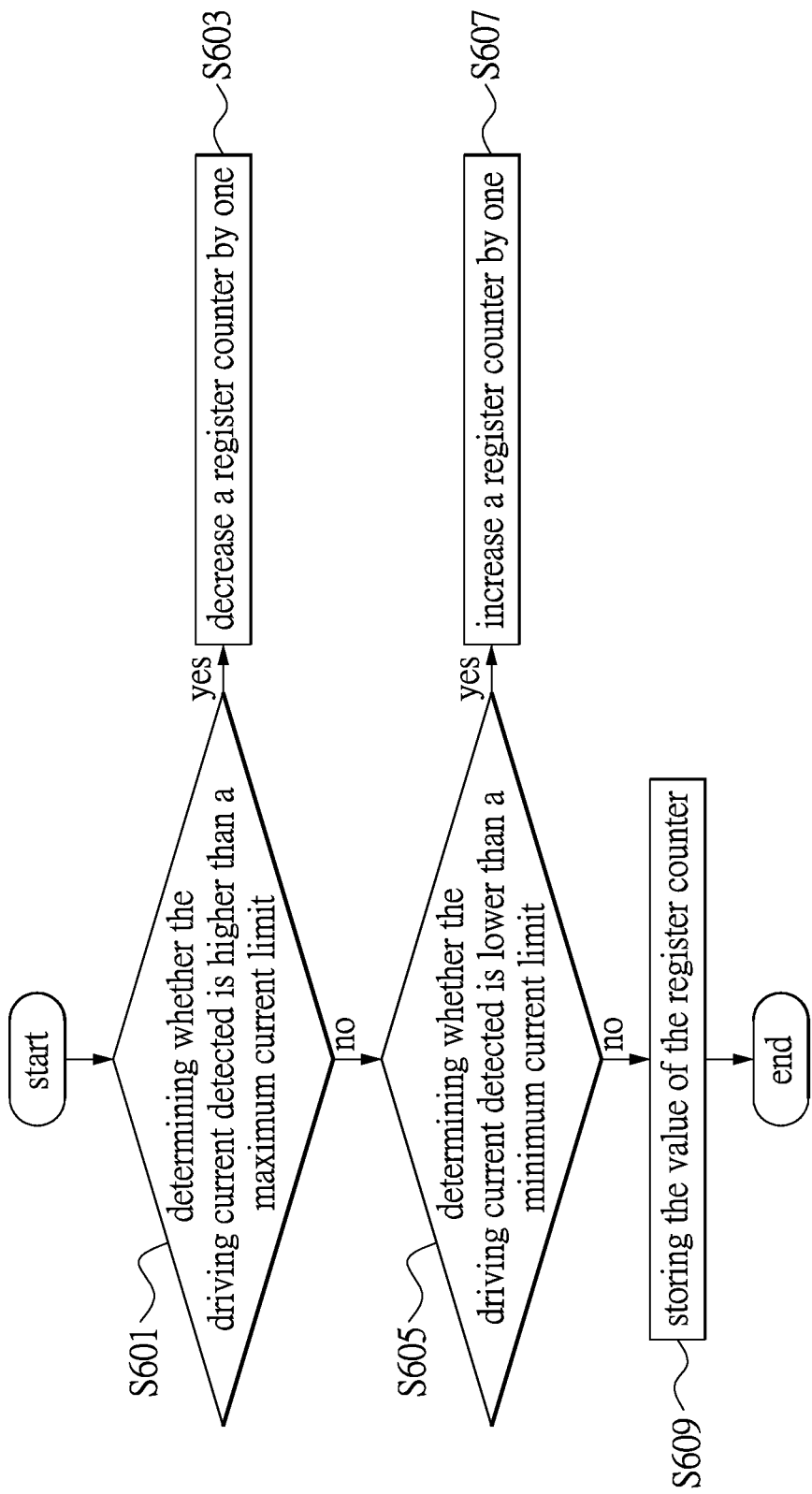
FIG. 6 is a flowchart illustrating a method for determining whether the driving current exceeds a current range defined for an optical input device provided in accordance to an exemplary embodiment of the present disclosure.

The processor 47 can determine whether the driving current detected exceeds the current range by determine whether the driving current is higher than the maximum current limit or lower than the minimum current limit. Please refer to FIG. 6 in conjunction with FIG. 4 and FIG. 5, wherein FIG. 6 shows a flowchart illustrating a method for determining whether the driving current exceeds a current range defined for an optical input device provided in accordance to an exemplary embodiment of the present disclosure. FIG. 6 can be executed during the execution of Step S503 in FIG. 5 of determining whether the driving current exceeds the current range.

In Step S601, the processor 47 determines whether the driving current detected is higher than the maximum current limit defined. When the driving current is detected to be higher than the maximum current limit, the processor 47 executes Step S603; otherwise, the processor 47 continues to execute Step S605.

In Step S603, the processor 47 decreases the register counter by one and correspondingly adjust the current mirror circuit 431 to finely reduce the driving current ILED. Specifically, the processor 47 can reduce the reference current as well as reduce the number of the current mirror branches turned on so as to finely tune down the driving current ILED.

In Step S605, the processor 47 determines whether the driving current detected is lower than the minimum current limit defined. When the driving current is detected to be lower than the minimum current limit, the processor 47 executes Step S607; otherwise, the processor 47 executes Step S609.

In Step S607, the processor 47 increases the register counter by one and correspondingly adjust the current mirror circuit 431 to finely increase the driving current ILED. Specifically, the processor 47 can increase the reference current as well as the number of the current mirror branches to be turned on to finely increase the driving current ILED.

In Step S609, the processor 47 records and stores the value of the register counter by writing the value of the register counter into the OTP register 471.

Such that, during the end-user operation, the current mirror circuit can be automatically configured according to the value stored in the OTP register 471 and causes the driving current ILED to fall within the current range designed.

It shall be noted that the maximum current limit in the instant embodiment is configured according to +10% of a target driving current while the minimum current limit is configured according to −10% of the target driving current. The maximum current limit and the minimum current limit can be predetermined and stored into the memory of the processor 47. However, the maximum current limit does not necessarily limited to +10% and the minimum current limit does not necessarily limited to −10%.

The processor 47 can be implemented by a processing chip disposed in the optical input device. The processor 47 can include but not limited to a microcontroller, or an embedded controller programmed with the calibration procedure and fault detection algorithms through firmware design. Specifically, the calibration procedure described in FIG. 5 and FIG. 6 can be respectively implemented by writing the corresponding firmware into the nonvolatile memory of the processor 47.

It worth to noted that the rest circuitry of the driving circuit 40 is essential the same as the driving circuit 10 and based on the above elaborations, those skilled in the art should be able to infer the operation associated with the driving circuit 40 such as the fault detection operation, hence further descriptions are therefore omitted. The exact structure, exact implementation method, and/or the exact connection method associated with current mirror circuit 431 may depend upon the specific design and/or operational requirement and shall not be limited thereto.

(Another Exemplary Embodiment of a Driving Circuit for an Optical Input Device)

The present disclosure further provides a driving circuit of an optical input device, which is operable for finely adjusting the driving current during the end-user operation of the optical input device. Please refer to FIG. 7, which shows a diagram of a driving circuit for the optical input device provided in accordance to another exemplary embodiment of the present disclosure.

Figure 7:
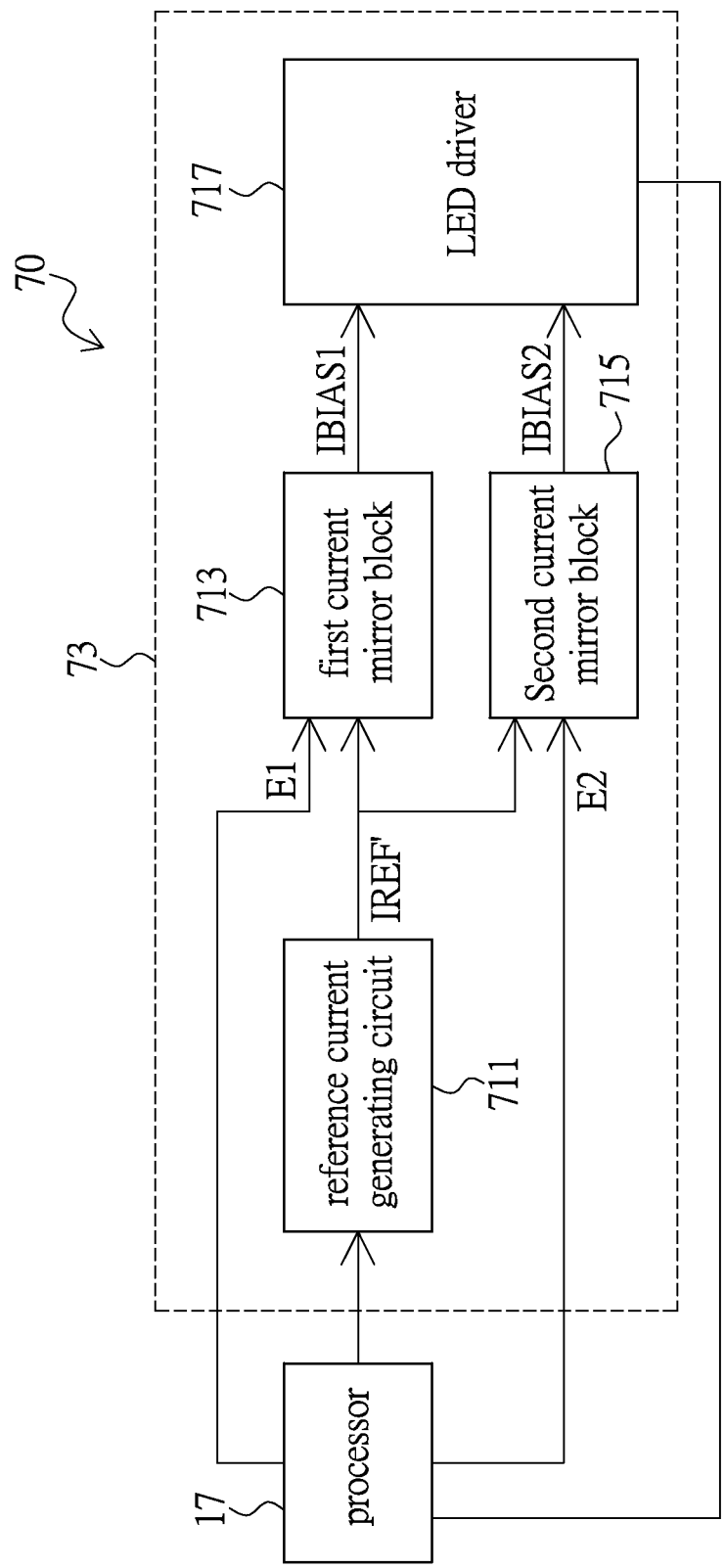
FIG. 7 is a diagram of a driving circuit for an optical input device provided in accordance to another exemplary embodiment of the present disclosure.

The driving circuit 70 similar to the driving circuit 10 is configured for operatively controlling the illumination operation of a light source of the optical input device based on the brightness of a navigation surface (such as a mouse pad or a desktop) of the optical input device (not shown in FIG. 7). The driving circuit 70 of FIG. 7 is different from the driving circuit 10 of FIG. 1 in the circuitry of a driving unit 73. The driver unit 73 includes a reference current generating circuit 711, a first current mirror block 713, a second current mirror block 715, and a LED driver 717. The reference current generating circuit 711, the first current mirror block 713, and the second current mirror block 715 operatively provide wide range of the driving current ILED with fine tuning steps to suit varies light conditions of the navigation surface.

The reference current generating circuit 711, the first current mirror block 713, the second current mirror block 715, and the LED driver 717 are respectively coupled to the processor 17. The reference current generating circuit 711 is coupled to the first current mirror block 713 and the second current mirror block 715, respectively. The LED driver 717 is coupled to the cathode of the LED 20 and the ground. The first current mirror block 713 and the second current mirror block 715 are coupled to the LED driver 717 to adjust the driving current ILED flowing through the LED 20.

More specifically, the reference current generating circuit 711 is configured to operatively generate a reference current IREF based on a second bias voltage, wherein the second bias voltage is outputted by the processor 17. The first current mirror block 713 is configured to operatively mirror the reference current IREF to generate a first bias current IBIAS1 which lies a first specific range upon receiving a first enable signal E1. The second current mirror block 715 is configured to operatively mirror the reference current IREF to generate a second bias current IBIAS2 which lies in a second specific range upon receiving a second enable signal E2. The driving current ILED flowing through the LED20 is configured to be equal to the sum of the first bias current IBIAS1 and the second bias current IBIAS2.

Particularly, a lower limit of the second specific range is configured to be larger than an upper limit of the first specific range while an upper limit of the second specific range is lower than a maximum current limit of the driver current. The maximum current limit is defined according to an eye safety level according to the eye safety standard.

In the instant embodiment, the first current mirror block 713 comprises of a plurality of current mirror branches for generating the first bias current IBIAS upon receiving the first enable signal E1 such that the driving current ranges from 0.5 mA to 31.5 mA. The second mirror block 715 comprises a plurality of current mirror branches for generating a second bias current added to the first bias current IBIAS1 upon receiving the second enable signal E2 such that the driving current ILED ranges from 32 mA to 63.5 mA.

In other words, the processor 17 can adjust driving current ILED for a wide range (i.e., 0.5 mA to 63.5 mA) though control the operations of the reference current generating circuit 711, the first current mirror block 713, and the second current mirror block 715.

Briefly, during a frame capturing periods, the processor 17 operatively configures and outputs the second bias voltage to the reference current generating circuit 711 according to a bias control signal. The processor 17 selectively enables at least one of the first current mirror block 713 and the second current block 715 to provide the first bias current IBIAS and/or the second bias current IBIAS2 to the LED driver 717, so as to finely adjust the driving current ILED flowing through the LED 20.

When the processor 17 operates to configure the driving current to be range from 0.5 mA to 31.5 mA according to the bias control signal. The processor 17 correspondingly configures the reference current IREF. At the same time, the processor 17 outputs the first enable signal E1 to activate the first current mirror block 713 while disables the second current mirror block 715. The processor 17 selectively turns on the current mirror branches in the first current mirror block 713 to generate the first bias current IBIAS1 to fine tune the driving current ILED within 0.5 mA~31.5 mA.

When the processor 17 operates to configure the driving current to be range from 32 mA to 63.5 mA according to the bias control signal. The processor 17 correspondingly configures the reference current IREF. At the same time, the processor 17 outputs the first enable signal E1 and the second enable signal E2 to activate the first current mirror block 713 and the second current mirror block 715. The processor 17 then turns on all the current mirror branch to generate the first bias current IBIAS1 while selectively controls the operation of each current mirror branch in the second current mirror block 715 to generate the second bias current IBIAS2 to finely tune the driving current ILED within 32 mA~63.5 mA.

The bias control signal in the instant embodiment is a 7-bit control signal providing 128 levels (e.g., 2^7) of adjustment to the reference current IREF. The processor 17 can configure reference current IREF according to the bias control signal. However, in practice, the bias control signal can also be implemented by 8-bit or 12-bit control signal depending upon the precision or step levels needed for configuring the reference current IREF. The higher number of bits used yields higher the precision in configuring the reference current IREF.

In another implementation, the driving circuit 70 can include more than two current mirror block for enhance the specific driving current range, and the specific driving current range is limited according to the capability of the driver unit so as to prevent the driver unit from being damage by the excessive driving current ILED.

Figure 8:
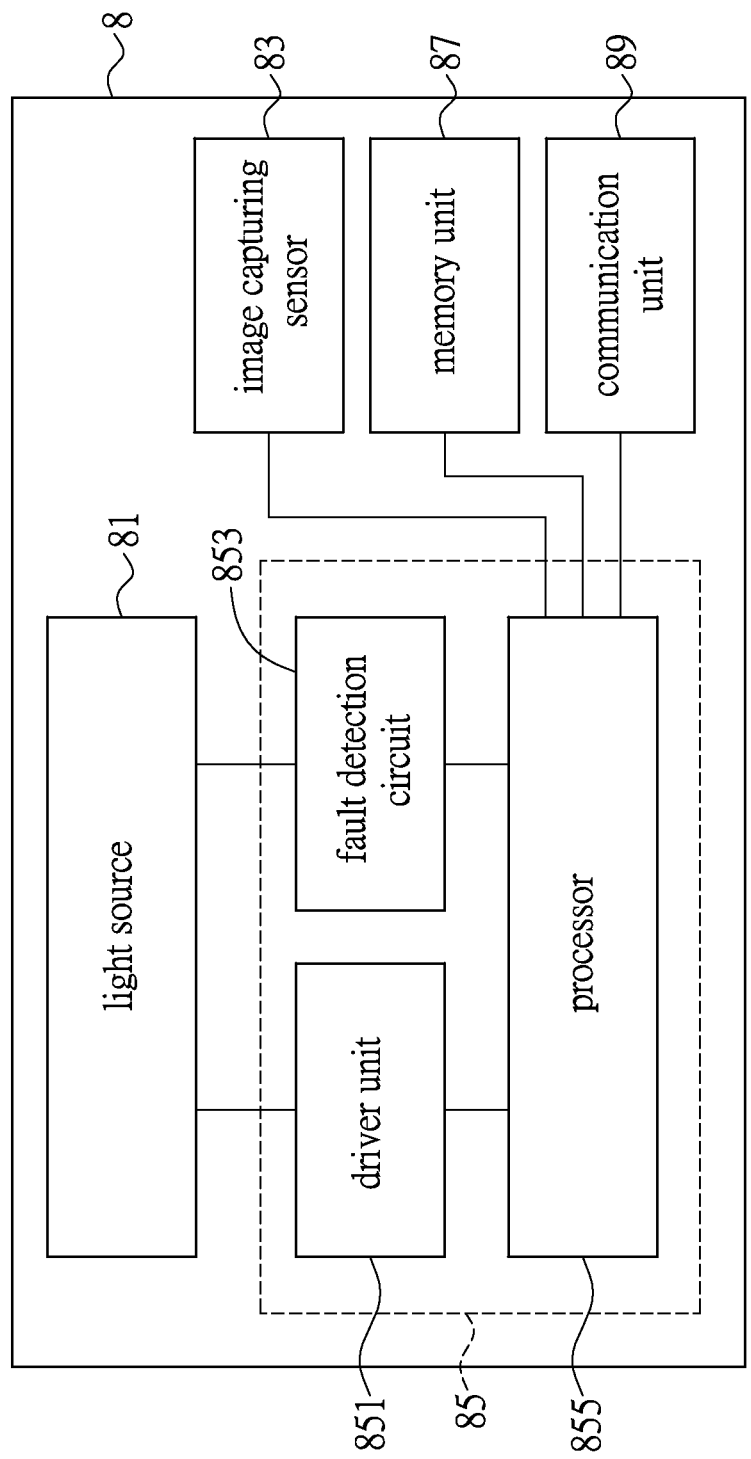
FIG. 8 is a diagram of an optical input device provided in accordance to an exemplary embodiment of the present disclosure.

It worth to note that the rest circuitry of the driving circuit 70 is essential the same as the driving circuit 10 and based on the above elaborations, those skilled in the art should be able to infer the operation associated with the driving circuit 70 such as fault detection operation, hence further descriptions are therefore omitted. FIG. 8 merely serves to illustrate an implementation of the driving circuit with fine adjustment for driving current during the end-user operation of the optical input device, and the present disclosure is not limited thereto.

(An Exemplary Embodiment of an Optical Input Device)

Please refer to FIG. 8, which shows a diagram of an optical input device provided in accordance to an exemplary embodiment of the present disclosure. The optical input device 8 can include but not limited to a wired optical mouse, wireless optical mouse, a wireless track pad, or a wireless joystick.

In the instant embodiment, the optical input device 8 is equipped with a battery (not shown) for providing the necessary operational power, wherein the battery may be a dry cell battery. The optical input device 8 is wirelessly or wired connected to a host computer (not shown) and wirelessly or wired transmits the displacement information computed to a host computer so as to control the movement of a cursor displayed on a display connected to the host computer.

The optical input device 8 includes a light source 81, an image capturing sensor 83, a driving circuit 85, a memory unit 87, and the communication unit 89.

In the instant embodiment, the light source 81 has at least a LED. In another embodiment, the light source 81 may comprise of a plurality of series-connected LEDs. In another embodiment, the light source 81 may comprise of a laser diode. The image capturing sensor 83 may be implemented by a charge-coupled device (CCD) image sensor or a complementary metal oxide semiconductor (CMOS) image sensor or a BJT image sensor. Those skilled in the art should be able to design according to practical application requirement and the instant embodiment is not limited thereto.

The driving circuit 85 further includes a driver unit 851, a fault detection circuit 853, and a processor 855. The light source 81 is coupled to the driver unit 851 and the fault detection circuit 853. The image capturing sensor 83, the driver unit 851, the fault detection circuit 853, the memory unit 87, and the communication unit 89 are coupled to the processor 855. The processor 855 operatively drives the driver unit 851 to generate a driving current for controlling the illumination operation of the light source 81.

During the frame capturing period, the processor 855 turns on the light source 81 and controls the driver unit 851 to drive the light source 81 to illuminate a navigation surface of the optical input device 8. The processor 855 at same time controls the image capturing sensor 83 to capture images reflected from the navigation surface and perform tracking operation based on the image captured.

The processor 855 operatively determines the displacement, the speed, and the direction of the optical input device 8 as the optical input device 8 moves across the navigation surface by computing image correlation between consecutive images. Image correlation techniques for computing displacement of an optical input device are known techniques hence further descriptions are hereby omitted. The processor 855 controls the communication unit 89 to transmit the displacement information wirelessly or wired to the host computer so as to correspondingly control the movement of the cursor.

The processor 855 operable to initiate a fault detection period, during which, the processor 855 activates the fault detection circuit 853 to detect whether one end of the light source 81 connected to the driver unit 851 has been shorted so as to determine whether the brightness of the light source 81 might potentially cause the eye safety hazard.

When the processor 855 determines that one end of the light source 81 connected to the driving unit has been shorted, the processor 855 disables the operations of the light source 81 and the image capturing sensor 83 so as to disable the operation of the optical input device, thereby provides safety guard against eye safety hazard.

The memory unit 87 is configured to store necessary firmware for implementing the fault detection algorithm. The memory unit 87 further can be configured to store the image captured and the displacement computed.

It shall be noted that the processor 855 can initiate the fault detection period before or after each frame capturing periods, or initiate after a predetermined number of frame capturing periods to constantly verifying whether the brightness generated by the light source 81 might unsafe to the human eye, i.e., causes eye safety hazard.

Incidentally, the processor 855 of the driving circuit 85 may be implemented by a processing chip disposed in the optical input device 8. The processor chip can include but not limited to a microcontroller, or an embedded controller programmed with necessary firmware for implementing the fault detection algorithm, and the instant embodiment is not limited thereto. The memory unit 87 in the instant embodiment can be implemented by a volatile or a non-volatile memory such as a flash memory, a read only memory, or a random access memory, and the instant embodiment is not limited to the example provided herein. The communication unit 89 can be implemented by a wired transmission interface such as, a USB interface or PS/2 interface, or a wireless transmission interface e.g., a Bluetooth interface, or a Wi-Fi interface. The exact type, the exact structure, and/or implementation method associated with the communication unit 89 can be configured according to the type and exact structure of the host computer and the optical input device 8, thus the present disclosure is not limited thereto.

The driving circuit 85 can be implemented by the driving circuit 10 depicted in FIG. 1. In another embodiment, the driving circuit 85 can be implemented by the driving circuit 40 of FIG. 4 for being able to perform driving current calibration before factory shipment so that the driving current is invariant to processing factors such as process variation. In another implementation, the optical input device 8 can also adopts the driving circuit 70 of FIG. 7 for possessing the ability to finely tune the driving current flowing through the light source so as to provide wide range of driving current for various type of navigation surface (e.g., a brighter surface or a darker surface). The exact implementation of the driving circuit used in the optical input device 8 may depend upon the practical operational requirement, and the present disclosure is not limited thereto.

Hence, FIG. 8 is merely used to illustrate an implementation of the optical input device using a driving circuit with fault detection mechanism and the present disclosure is not limited thereto.

In summary, exemplary embodiments of the present disclosure provides a driving circuit and an optical input device having the same. The driving circuit can utilize a simple, low cost, and low power fault detection mechanism to effectively protect the end user from potential eye hazard. In particular, the driving circuit is operable to determine whether the light source of the optical input device has been shorted and disables the operation of the optical input device when detected that the light source is shorted. Thereby, effectively prevent the light source generating brightness that exceeds the eye safety requirement and causing potentially hazards to the end user due to excessive driving current.

In addition to the fault detection mechanism, the present disclosure also provides circuitry for calibrating the driving current to the target value to provide sufficient lights for image capturing sensors to successively capture frame for tracking the movement of the optical input device. The present disclosure further provides a current generating circuit for the driving circuit such that the driving circuit is capable of fine tuning the driving current over a wide current range for various type of navigation surface of the optical input device.

It is noteworthy that the coupling connections among the aforementioned components include direct and/or indirect electrical connections and the scope of the present invention does not limit the type of connection employed as long as the choice type of connection selected is able to fulfill the electrical signal transmission functionality. The techniques described in the aforementioned embodiments may be combined or used independently. Furthermore, the associated components may be added, deleted, modified or replaced base on the needs of specific design and functional requirements and the present disclosure should not be limited thereto. From the explanation of the aforementioned embodiment, those skilled in the art should be able to deduce the other embodiments according to the disclosure of the present invention, and further descriptions are therefore omitted.

The above-mentioned descriptions represent merely the exemplary embodiment of the present disclosure, without any intention to limit the scope of the present disclosure thereto. Various substitutions and modifications on the illustrated circuit configuration or hardware structure have been suggested in the foregoing description, and other will occur to those of ordinary skill in the art. Various equivalent changes, alternations or modifications based on the claims of present disclosure are all consequently viewed as being embraced by the scope of the present disclosure.

What is claimed is:

1. A driving circuit, used for an optical input device, comprising:
   a switch having a first end thereof coupled to a power terminal to receive a supplying voltage, and a second end thereof coupled to an anode of a light emitting diode (LED) of a light source;
   a driver unit coupled between a cathode of the LED and a ground, and the driver unit configured to operatively generate a driving current controlling the illumination of the LED according to a control signal;
   a fault detection circuit coupled to the cathode of the LED, and configured to operatively detect whether the cathode of the LED is shorted and generate a fault signal when detected that the cathode of the LED is shorted; and
   a processor coupled to a control end of the switch, the driver unit, and the fault detection circuit, the processor operatively outputting the control signal to control the illumination of the LED according to the brightness of a navigation surface of the optical input device;
   wherein the processor initiates a fault detection period, during which the processor turns off the switch and the driver unit to cause the cathode of the LED to be floating while activates the fault detection circuit to detect whether the cathode of the LED is shorted;
   wherein the fault detection circuit outputs a fault clear signal to the processor to enable the operation of the optical input device when detected that the cathode of the LED is not shorted; and
   wherein the processor turns off the switch and the driving unit to disable the operation of the optical input device upon receiving the fault signal from the fault detection circuit.

2. The driving circuit according to claim 1, wherein the processor initiates the fault detection period before or after each frame capturing period.

3. The driving circuit according to claim 1, wherein the fault detection circuit comprises:
   a first PMOS transistor having a source thereof coupled to a bias terminal to receive an operating voltage, a drain thereof coupled to the cathode of the LED, and a gate thereof configured to receive a first bias voltage, the first PMOS transistor weakly pulling up the cathode of the LED to the operating voltage upon receiving the first bias voltage;
   a first NMOS transistor having a gate thereof coupled to a drain thereof, the drain thereof also coupled to the drain of the first PMOS transistor, and a source thereof coupled to the ground;
   a second PMOS transistor having a source thereof coupled to the bias terminal to receive the operating voltage, and a gate thereof coupled to the gate of the first PMOS transistor, the second PMOS transistor operatively generating a reference voltage at a drain thereof upon receiving the first bias voltage;
   a second NMOS transistor having a gate thereof coupled to a drain thereof, and a source thereof coupled to the ground; and
   a comparator having a first input terminal thereof coupled to the cathode of the LED, a second input terminal thereof coupled to the drain of the second PMOS transistor to receive the reference voltage, and a first output terminal coupled to the processor, the comparator configured to operatively compare a detection voltage outputted by the cathode of the LED with the reference voltage;

wherein when the detection voltage at the cathode of the LED is detected to be lower than the reference voltage, the comparator outputs the fault signal causing the processor to disable the operation of the optical input device.

4. The driving circuit according to claim 3, wherein the first PMOS transistor and the second PMOS transistor are scaled such that a first bias current flowing through the first PMOS transistor is at least twice of a second bias current flowing through the second PMOS transistor.

5. The driving circuit according to claim 1, wherein the driver unit comprises:
 a third NMOS transistor having a drain thereof coupled to the cathode of the LED, and a gate thereof configured to receive an operating voltage;
 a fourth NMOS transistor having a drain thereof coupled to a source of the third NMOS transistor, and a source thereof coupled to a ground;
 a fifth NMOS transistor having a drain thereof coupled to a gate thereof, a source thereof coupled to the ground, the gate of the fifth NMOS transistor further coupled to a gate of the fourth NMOS transistor; and
 a bias current generating circuit coupled between the operating voltage and the drain of the fifth NMOS transistor, and the bias current generating circuit configured for operatively providing a bias current with zero temperature coefficient flowing through the LED.

6. The driving circuit according to claim 5, wherein the bias current generating circuit comprises:
 a positive temperature coefficient current generating circuit, operatively generating a positive temperature coefficient current according to the temperature variation of the optical input device;
 a negative temperature coefficient current generating circuit, operatively generating a negative temperature coefficient current according to the temperature variation of the optical input device; and
 a zero temperature coefficient current generator, operatively summing the positive temperature coefficient current and the negative temperature coefficient current at a predetermined ratio to generate the bias current with zero temperature coefficient.

7. The driving circuit according to claim 5, wherein the bias current generating circuit comprises of a bandgap current reference circuit.

8. The driving circuit according to claim 1, wherein the driver unit comprises of a current mirror circuit, the current mirror circuit configured for providing the driving current, wherein the processor configures a maximum current limit and a minimum current limit defining a current range for the driving current and executes a calibration procedure before the factory shipment of the optical input device, the calibration procedure comprising:
 a) detecting the driving current;
 b) determining whether the driving current detected exceeds the current range;
 c) when the driving current detected exceeds the current range, adjusting a register counter in the processor to configure a reference current of the current mirror circuit;
 d) repeating steps a) through c) until the driving current detected falls within the current range; and
 e) storing the value of the register counter into a one-time programmable register of the processor.

9. The driving circuit according to claim 8, wherein the step of adjusting the register counter further comprises:
 when the driving current detected is higher than the maximum current limit, decreases a register counter in the processor by one; and
 when the driving current detected is lower than the minimum current limit, increases the register counter by one.

10. The driving circuit according to claim 1, wherein the driving unit further comprises:
 a reference current generating circuit coupled to the processor, and configured to operatively generate a reference current based on a second bias voltage;
 a LED driver coupled to the cathode of the LED and the ground;
 a first current mirror block coupled to the reference current generating circuit and the LED driver, the first current mirror block operatively mirroring the reference current to generate a first bias current that lies in a first specific range upon receiving a first enable signal; and
 a second current mirror block coupled to the reference current generating circuit and the LED driver, the second current mirror block operatively mirroring the reference current to generate a second bias current that lies in a second specific range upon receiving a second enable signal;
 wherein during a frame capturing period, the processor adjusts the reference current according to a bias control signal and selectively enables at least one of the first current mirror block and the second current block to adjust the driving current flowing through the LED;
 wherein a lower limit of the second specific range is larger than an upper limit of the first specific range while an upper limit of the second specific range is lower than a maximum current limit of the driver current, wherein the maximum current limit is defined according to an eye safety level.

11. The driving circuit according to claim 1, wherein the switch comprises a third PMOS transistor having a source thereof coupled to the power terminal, a drain thereof coupled to the anode of the LED, and a gate thereof coupled to the processor.

12. An optical input device, comprising:
 a light source having at least a LED, and configured to operatively illuminate a navigation surface of the optical input device;
 an image capturing sensor, configured for capturing images reflected from the navigation surface; and
 a driving circuit coupled to the light source, the image capturing sensor, and the driving circuit comprising:
  a switch having a first end thereof coupled to a power terminal to receive a supplying voltage, and a second end thereof coupled to an anode of the LED;
  a driver unit coupled between a cathode of the LED and a ground, and configured to operatively generate a driving current to control the illumination of the LED according to a control signal;
  a fault detection circuit coupled to the cathode of the LED, and configured to operatively detect whether the cathode of the LED is shorted and generate a fault signal when detected that the cathode of the LED is shorted; and
  a processor coupled to a control end of the switch, the image capturing sensor, the driver unit, and the fault detection circuit, the processor operatively outputting the control signal to control the illumination of the LED according to the brightness of the navigation surface and disabling the operation of the optical input device upon receiving the fault signal;

wherein the processor initiates a fault detection period before each frame capturing period, during which the processor turns off the switch and the driver unit to cause the cathode of the LED to be floating while activates the fault detection circuit to detect whether the cathode of the LED is shorted;

wherein the fault detection circuit outputs the fault signal to cause the processor to turn off the switch and disable the operation of the optical input device when detected that cathode of the LED is shorted; and wherein the fault detection circuit comprises:

a first PMOS transistor having a source thereof coupled to a bias terminal to receive an operating voltage, a drain thereof coupled to the cathode of the LED, and a gate thereof configured to receive a first bias voltage, the first PMOS transistor weakly pulling up the cathode of the LED to the operating voltage upon receiving the first bias voltage;

a first NMOS transistor having a gate thereof coupled to a drain thereof, the drain thereof also coupled to the drain of the first PMOS transistor, and a source thereof coupled to the ground;

a second PMOS transistor having a source thereof coupled to the bias terminal to receive the operating voltage, and a gate thereof coupled to the gate of the first PMOS transistor, the second PMOS transistor operatively generating a reference voltage at a drain thereof upon receiving the first bias voltage;

a second NMOS transistor having a gate thereof coupled to a drain thereof, and a source thereof coupled to the ground; and a comparator having a first input terminal thereof coupled to the cathode of the LED, a second input terminal thereof coupled to the drain of the second PMOS transistor to receive the reference voltage, and a first output terminal coupled to the processor, the comparator configured to operatively compare a detection voltage outputted by the cathode of the LED with the reference voltage;

wherein when the detection voltage at the cathode of the LED is detected to be lower than the reference voltage, the comparator outputs the fault signal; when the detection voltage is detected to be higher than the reference voltage, the comparator outputs a fault clear signal.

13. The optical input device according to claim 12, wherein the driving unit comprises:

a third NMOS transistor having a drain thereof coupled to the cathode of the LED, and a gate thereof configured to receive an operating voltage;

a fourth NMOS transistor having a drain thereof coupled to a source of the third NMOS transistor, and a source thereof coupled to a ground;

a fifth NMOS transistor having a drain thereof coupled to a gate thereof, a source thereof coupled to the ground, the gate of the fifth NMOS transistor further coupled to a gate of the fourth NMOS transistor; and a bias current generating circuit coupled between the operating voltage and the drain of the fifth NMOS transistor and the bias current generating circuit configured for operatively providing a bias current with zero temperature coefficient flowing through the LED.

14. The optical input device according to claim 12, wherein the driver unit comprises of a current mirror circuit for providing the driving current, wherein the processor configures a maximum current limit and a minimum current limit to define a current range for the driving current and executes a calibration procedure before the factory shipment of the optical input device, the calibration procedure comprising:

a) detecting the driving current;
b) determining whether the driving current detected exceeds the current range;
c) when the driving current detected exceeds the current range, adjusting a register counter in the processor to configure a reference current of the current mirror circuit;
d) repeating steps a) through c) until the driving current detected falls within the current range; and
e) storing the value of the register counter into a one-time programmable register of the processor.

15. The optical input device according to claim 14, wherein the step of adjusting the register counter further comprises:

when the driving current detected is higher than the maximum current limit, decreases a register counter in the processor by one; and
when the driving current detected is lower than the minimum current limit, increases the register counter by one.

16. The optical input device according to claim 12, wherein the driving circuit further comprises:

a reference current generating circuit coupled to the processor, and configured to operatively generate a reference current;

a LED driver coupled to the cathode of the LED and the ground;

a first current mirror block coupled to the reference current generating circuit and the LED driver, and the first current mirror block operatively mirroring the reference current to generate a first bias current that lies in a first specific range upon receiving a first enable signal; and a second current mirror block coupled to the reference current generating circuit and the LED driver, the second current mirror block operatively mirroring the reference current to generate a second bias current that lies in a second specific range upon receiving a second enable signal, wherein a lower limit of the second specific range is larger than an upper limit of the first specific range while an upper limit of the second specific range is lower than a maximum current limit of the driver current, wherein the maximum current limit is defined according to an eye safety level;

wherein during a frame capturing periods, the processor operatively adjusts the reference current according to a bias control signal and selectively enables at least one of the first current mirror block and the second current block to adjust the driving current flowing through the LED.

* * * * *